United States Patent
Kwong et al.

(12) 
(10) Patent No.: US 6,528,737 B1
(45) Date of Patent: Mar. 4, 2003

(54) MIDPLANE CONFIGURATION FEATURING SURFACE CONTACT CONNECTORS

(75) Inventors: Herman Kwong, Kanata (CA); Richard R. Goulette, Arnprior (CA)

(73) Assignee: Nortel Networks Limited, St-Laurent (CA)

( * ) Notice: Subject to any disclaimer, the term of this patent is extended or adjusted under 35 U.S.C. 154(b) by 13 days.

(21) Appl. No.: 09/639,075

(22) Filed: Aug. 16, 2000

(51) Int. Cl.$^7$ ............................................. H01R 12/04

(52) U.S. Cl. ................. 174/262; 361/785; 361/788; 361/803

(58) Field of Search ................ 174/262, 250; 361/784, 803, 790, 788, 785; 439/61

(56) References Cited

U.S. PATENT DOCUMENTS

| | | | |
|---|---|---|---|
| 5,455,742 A | * 10/1995 | Phoy et al. | 361/778 |
| 5,887,158 A | 3/1999 | Sample et al. | |
| 5,949,656 A | * 9/1999 | Pinault | 361/778 |
| 6,058,019 A | * 5/2000 | Graves et al. | 361/778 |
| 6,328,572 B1 | * 11/2001 | Higashida et al. | 361/778 |
| 6,335,867 B1 | * 1/2002 | Ishibashi et al. | 361/778 |

OTHER PUBLICATIONS

Larry W. Burgess, Introducing Via–in–Pad Blind Via Technology to Any PCB Multilayer Fabricator, The Institute for Interconnecting and Packaging Electronic Circuits, Mar. 9–13, 1997 pp S15–2–1 to S15–2–4.

* cited by examiner

Primary Examiner—Albert W. Paladini

(57) ABSTRACT

A midplane board adapted for use in an electronic equipment shelf is provided. The midplane board includes a first surface having a plurality of contact elements adapted to engage corresponding contact elements on a first circuit board. The midplane board also includes a second surface in opposite relationship with the first surface. The second surface has a plurality of contact elements adapted to engage corresponding contact elements on a second circuit board in such a manner that at least a portion of a side of the first circuit board is opposed to at least a portion of a side of the second circuit board. The midplane includes at least one signal connection path including a buried via suitable for establishing a connection between a contact element on the first surface and a contact element on the second surface. The contact elements on the first surface define a first pattern while the contact elements on the second surface define a second pattern. The midplane board also includes an intersect area where at least a portion of the first pattern is opposite to at least a portion of the second pattern. The intersect area comprises a set of signal connection paths between the first pattern and the second pattern which define a certain pattern tile having a symmetrical layout along a given axis.

24 Claims, 8 Drawing Sheets

MIDPLANE CONFIGURATION FEATURING SURFACE CONTACT CONNECTORS

FIELD OF THE INVENTION

The present invention relates to high speed, high-density electronic equipment. More specifically, this invention relates to a midplane board featuring surface contact connectors.

BACKGROUND OF THE INVENTION

In recent years, the field of electronics has generally been characterized by a certain effervescence. In fact, ever-increasing consumer demands, research and development, and greater competition in the market place are all factors that are contributing to numerous innovations in this field. Architects of the next generation IP networks are therefore demanding exponentially higher system throughputs to sustain network traffic growth. However, this involves the use of high density, high-speed equipment and one of the key issues associated with this particular type of equipment pertains to the level of connectivity required between various electrical components such as circuit boards. More specifically, switching systems are required to properly direct different communication channels from an origin to a destination.

A method commonly used to interconnect a multitude of circuit boards carrying communication channels is backplane structures. In such structures, a backplane is placed at one end of an electronic equipment shelf and has a surface that receives a plurality of circuit boards. The circuit boards are oriented such that they are substantially parallel to one another. Generally, the backplane is located at the rear of the electronic equipment shelf, hence the term <<backplane>>.

A deficiency associated with backplane structures pertains to the level of connectivity required. Backplanes, as stated previously, have a single interconnection surface that receives circuit boards. As a result, only a limited number of circuit boards can be coupled to the backplane. In contemporary systems however, ever-increasing network traffic implies that numerous communication channels, and hence circuit boards, are necessary to achieve the required level of connectivity within a communication system.

Another traditional method uses a midplane board in conjunction with pin and box connectors. Such a midplane board is disclosed in U.S. Pat. No. 5,887,158 (Sample et al.) assigned to the Quickturn Design Systems, Inc. corporation. The content of this document is hereby incorporated by reference. The use of a midplane board is advantageous since it accommodates two sets of circuit boards arranged on either side of the midplane board. More specifically, the first surface of the midplane board is provided with a plurality of connector pins that engage corresponding sockets formed on the circuit connecting on the first surface. The opposite (second) surface of the midplane board also has connector pins that also engage sockets formed on circuit boards connecting on the second surface. The circuit boards connecting with the first surface are oriented in a direction that is either parallel or orthogonal to the circuit boards connecting with the second surface. When the connector pins of circuit boards positioned on opposite sides of the midplane board register at common junctions, holes, more commonly known as the "through hole", are drilled in the midplane in such a manner as to accommodate a single connector pin that traverses the midplane and thereby directly connects electrically both circuit boards.

Although the use of a midplane structure such as that described hereinabove is advantageous when compared to a more traditional backplane structure, it is not without its deficiencies. One of the disadvantages associated with the use of a through hole is the large space that each connector pin occupies. Thus, each connector requires a significant amount of midplane board space and this implies that the density of the connector pins is less than ideal. Moreover, another disadvantage in using through holes resides in the lack of freedom for the arrangement and positioning of the connector pins since the connector pins on both sides of the midplane board must register with one another to create the <<through holes>>.

Consequently, there is a need in the industry for providing an improved midplane board that overcomes at least in part the deficiencies of the prior art.

SUMMARY OF THE INVENTION

In accordance with a first broad aspect, the invention provides a midplane board for use in an electronic equipment shelf. The midplane board has two main opposite surfaces, namely a first surface and a second surface. The first surface comprises a plurality of contact elements adapted to engage corresponding contact elements on a first circuit board. The second surface comprises a plurality of contact elements adapted to engage corresponding contact elements on a second circuit board. At least one signal connection path is formed in the midplane board between a contact element on the first surface and a contact element on the second surface. The contact elements on the first surface are geometrically located with relation to the contact elements on the second surface in such a way that at least a portion of a side of the first circuit board (when connected with the first surface) will be opposed to at least a portion of a side of the second circuit board (when connected with the second surface). When at least a portion of a side of the first circuit board is opposed to at least a portion of a side of the second circuit board the two circuit boards are said to "intersect" one another. In this specification, "intersect" means that when an observer faces one of the main surfaces of the midplane, the observer will see both circuit boards cut-through one another. The condition of intersection is met irrespective of the angle at which the circuit boards cut one another. The angle may be anywhere from 90° to 0°.

The contact elements on the midplane are surface contact elements and form, with the corresponding contact elements on a circuit board, a surface electrical connector. This electrical connector is distinguished from a male/female type connector that is characterized by the presence of a pin that penetrates a socket. In the case of a surface electrical connector, at least the contact element on the midplane board is substantially flat.

The use of surface electrical connectors to establish an electrical connection between the midplane and a circuit board is advantageous because it no longer requires a precise registration between circuit boards on opposite sides of the midplane, as in the case of the "through hole" technology. With the present invention, the contact elements on one main surface of the midplane do not have to precisely match the location of the contact elements on the other main surface in order for them to be electrically connected. This added level of flexibility can be exploited to yield advantages such as increasing the connection density, among others.

In accordance with yet another broad aspect, the invention provides a midplane board comprising first and second surfaces. Each surface, which is in opposite relationship with the other, features a plurality of contact elements. The midplane board comprises at least one intersect area that is characterized by a plurality of signal connection paths that are operative for establishing connections between the contact elements on both surfaces.

In a specific example of implementation, the plurality of signal connection paths defines a certain pattern tile that is symmetrical along first and second axes. The pattern tile is reproduced along the length and width of the midplane board and a plurality of intersect areas can thus be provided.

Other aspects and features of the present invention will become apparent to those ordinarily skilled in the art upon review of the following description of specific embodiments of the invention in conjunction with the accompanying figures.

Figure 1:
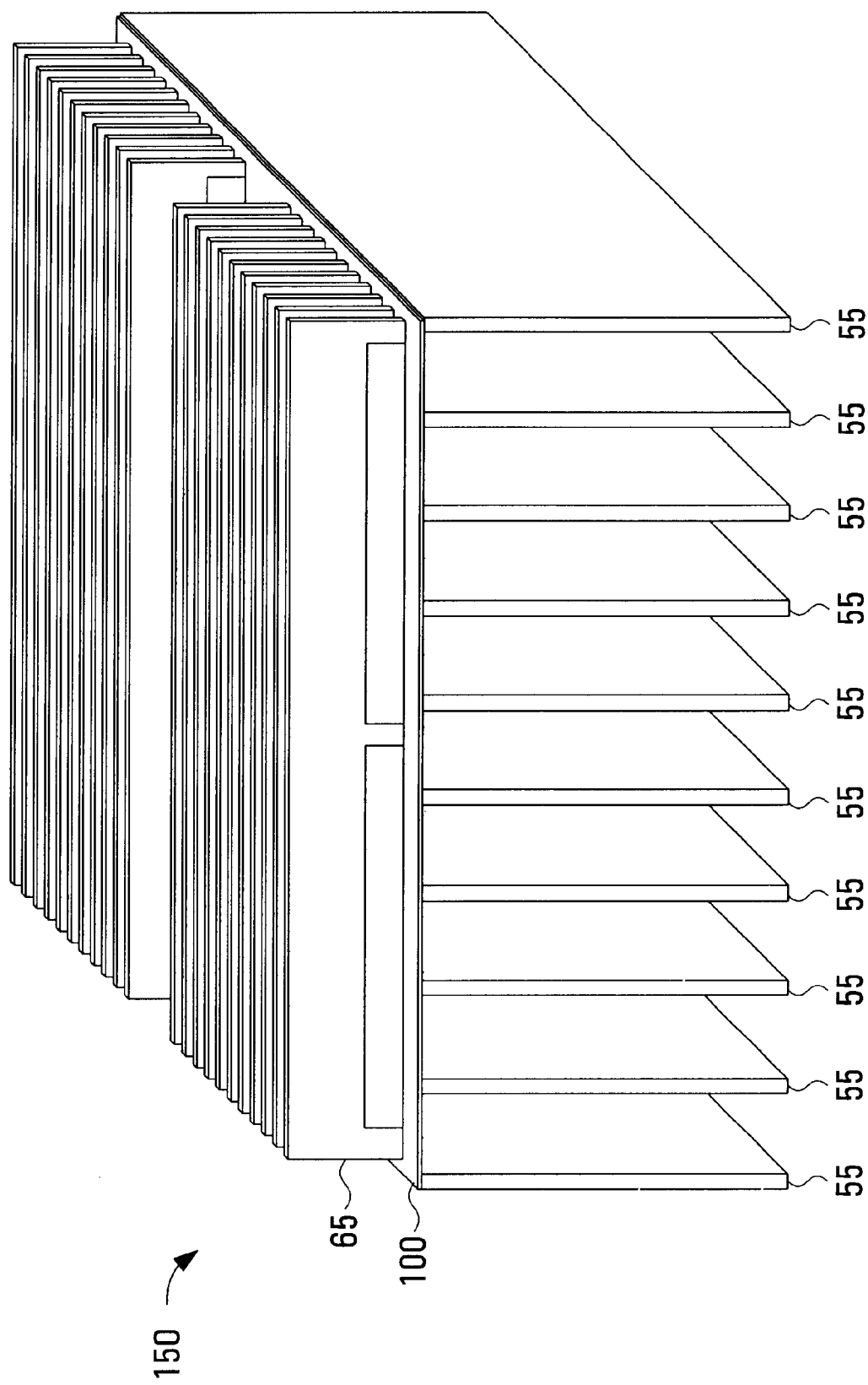
FIG. 1 is a perspective view of a midplane board constructed in accordance with an example of implementation of the invention with circuit boards mounted on each main surface thereof.

In the drawings, embodiments of the invention are illustrated by way of example. It is to be expressly understood that the description and drawings are only for purposes of illustration and as an aid to understanding, and are not intended to be a definition of the limits of the invention.

DETAILED DESCRIPTION OF THE DRAWINGS

FIG. 1 depicts a switching assembly designated by the reference numeral 150. The switching assembly 150 comprises a midplane board 100 that is adapted to receive circuit boards on two opposite surfaces. More specifically, a first surface of the midplane board 100 is adapted to receive a plurality of circuit boards in the form of port cards 55 while a second surface, opposite to the first surface, receives a plurality of circuit boards in the form of switch cards 65. In the specific example shown in FIG. 1, the orientation of the port cards 55 is orthogonal to the orientation of the switch cards 65. The midplane enables signal transfer between the port cards 55 and the switch cards 65 by providing electrical contacts on its two opposite surfaces. In operation, electrical signals received by the port cards 55 are routed to a proper destination via the midplane board 100 and the switch cards 65. In use, the switching assembly 150 is housed into a suitable enclosure that is normally referred to as an "electronic equipment shelf". Such enclosure is not shown in the drawings because it is of a type well known to those skilled in the art. The enclosure can be made of any suitable material that can provide the requisite degree of protection to the delicate structure of the midplane board 100, the port cards 55 and the switch cards 65. Another function of the enclosure is to provide a physical support for the midplane board 150 and the circuit boards electrically connected hereto. More specifically, the enclosure is provided with a plurality of locating assemblies, one for each circuit board that physically supports the circuit board and maintains the circuit board precisely registered with the midplane board. Such locating assemblies can take various forms. In one specific example, the locating assembly includes guide rails that slidingly receive opposite edges of the circuit board. This allows the circuit board to be removed when a replacement becomes necessary. At this end, the equipment shelf has an access door or bay through which the circuit boards are accessible. To remove one or more of the circuit boards, the technician simply pulls the circuit board strongly enough so as to slide it out from the guide rails. To replace the circuit board, the technician inserts it in the guide rails and slides the circuit board therein until its edge physically contacts the midplane board. The guide rails precisely guide the movement of the circuit board toward the midplane such that the electrical connections between the circuit board and the midplane are correctly made.

Figure 2:
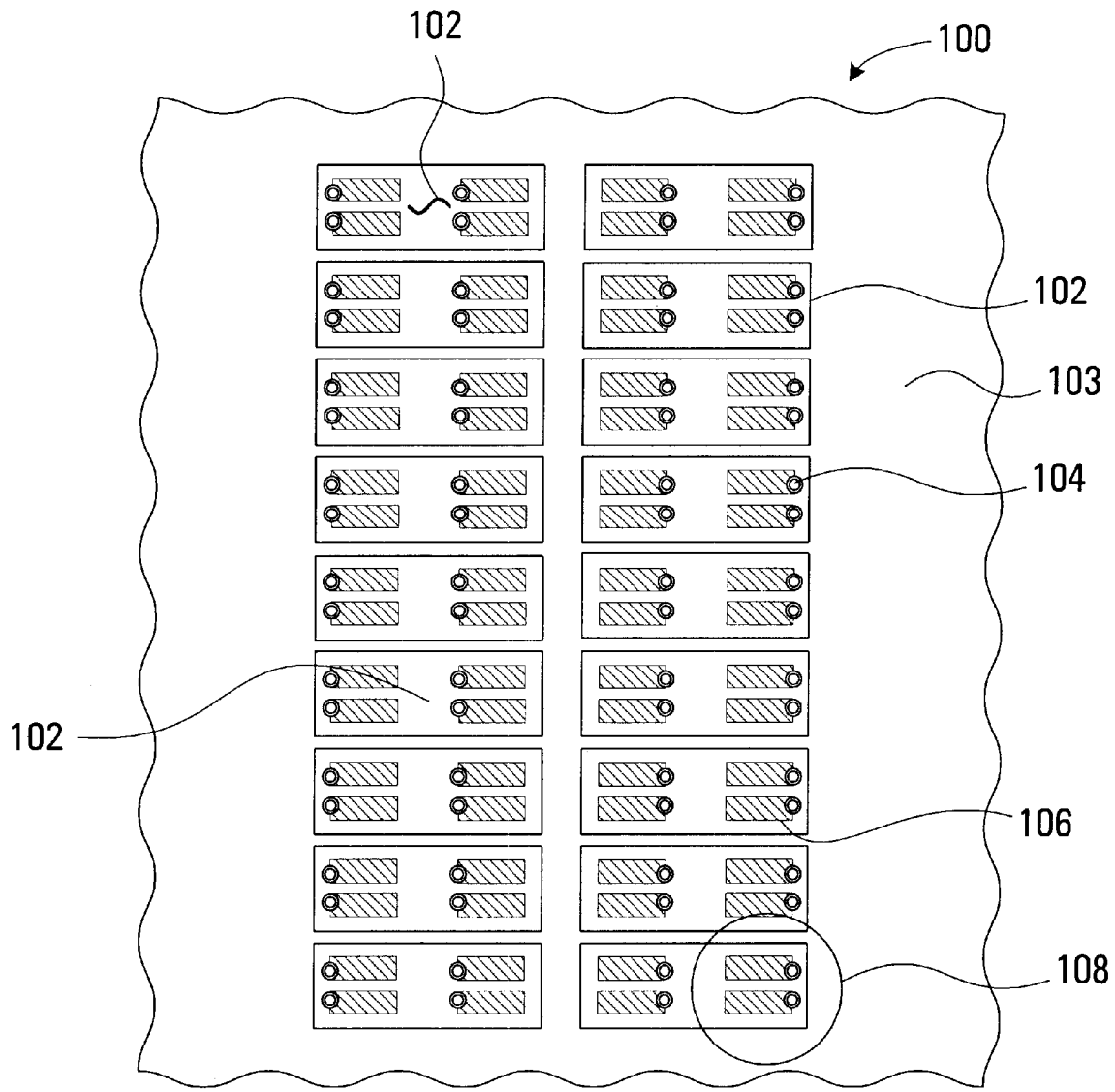
FIG. 2 is an enlarged fragmentary planar view of the midplane board of FIG. 1, showing the first main surface of the midplane board.

FIG. 2 is a fragmentary view of the first surface of the midplane board 100. The midplane board 100 has a plurality of surface contact elements. More specifically, the surface contact elements are essentially planar contact pads 106 made of conductive material such as copper, gold, silver or any other material that is suitable for conveying an electrical signal. In the specific example shown in the figure, the contact pads 106 are comprised of copper and are plated with hard nickel and hard gold. Advantageously, the hard nickel and hard gold allows the surface oxidation of the copper to be substantially avoided and general surface wear to be reduced. The contact pads 106 are of oblong shape in order to increase the contact surface area and thus facilitate registration with the contact elements from the circuit boards as well as compensate for wiping action that may occur when a circuit board is brought in contact with midplane board 100.

Each contact pad 106 is associated with a respective microvia 104 for transporting electrical signals through the midplane board 100. Although microvias and buried vias are fairly well known in the art, a specific implementation will be herein described for the sake of clarity. Generally speaking, microvias are holes in the midplane board that are plated with a conductive material such as copper and which interconnect one external surface of the midplane board 100 to one or more of its internal layers and/or the opposite external surface. Buried vias, which will be described hereinafter with reference to a subsequent figure, have a similar structure than that of microvias but interconnect one or more internal layers of the midplane board and do not extend to any one of the external surfaces of the main board 100. Since a buried via does not connect to an external surface, the conductive hole is completely internal to the structure of the midplane board 100. Microvias and buried vias are typically fabricated using a laser drilling process and, alternatively, by using a mechanical drilling process. For more information on the fabrication of vias, the reader is invited to consult the paper entitled "Introducing Via-in-Pad Blind Via Technology to Any PCB Multilayer Fabricator" by L. W. Burgess, which was presented at the IPC Printed Circuits Expo in March of 1997. The contents of this paper are hereby incorporated by reference.

The microvias 104 are capable of channeling electrical signals into an interior layer of the midplane board 100. FIG. 2 further shows that the contact pads 106 and their corresponding microvias 104 are coupled in pairs 108. Each pair 108 carries a differential signal. A differential signal expresses information as a difference between two values. Thus, all signals are expressed in relative fashion (i.e., as a function of one another) and the adverse impact associated with extreme voltage variations is thereby avoided. Further advantages associated with the use of a differential pair reside in the reduction of cross talk and an improved rejection of common-mode electrical noise. Furthermore, creating a differential signal also lessens the ground drop. Although FIG. 2 shows that the microvias are regrouped into differential pairs, it should be expressly understood that single ended signals can be used without detracting from the spirit of the invention.

A significant portion of each external surface of the midplane board 100 is covered by a ground plane 103. The ground plane is a conductive coating or layer, typically made of copper foil. The ground plane 103 has ground clearances or ground voids 102 where the contact pads 106 and the respective microvias 104 are located. Thus, electrical signals of varying voltages are capable of being conveyed by the contact pads 106 and the microvias 104. Although the ground clearance 102 depicted in FIG. 2 is of approximately rectangular shape, it should be expressly understood that a ground clearance of any shape remains within the scope of this invention. FIG. 2 also shows that each ground clearance 102 surrounds two microvia pairs 108. It should be understood, however, that a ground clearance 102 surrounding any number of microvia pairs 108 remains within the scope of this invention.

Figure 3:
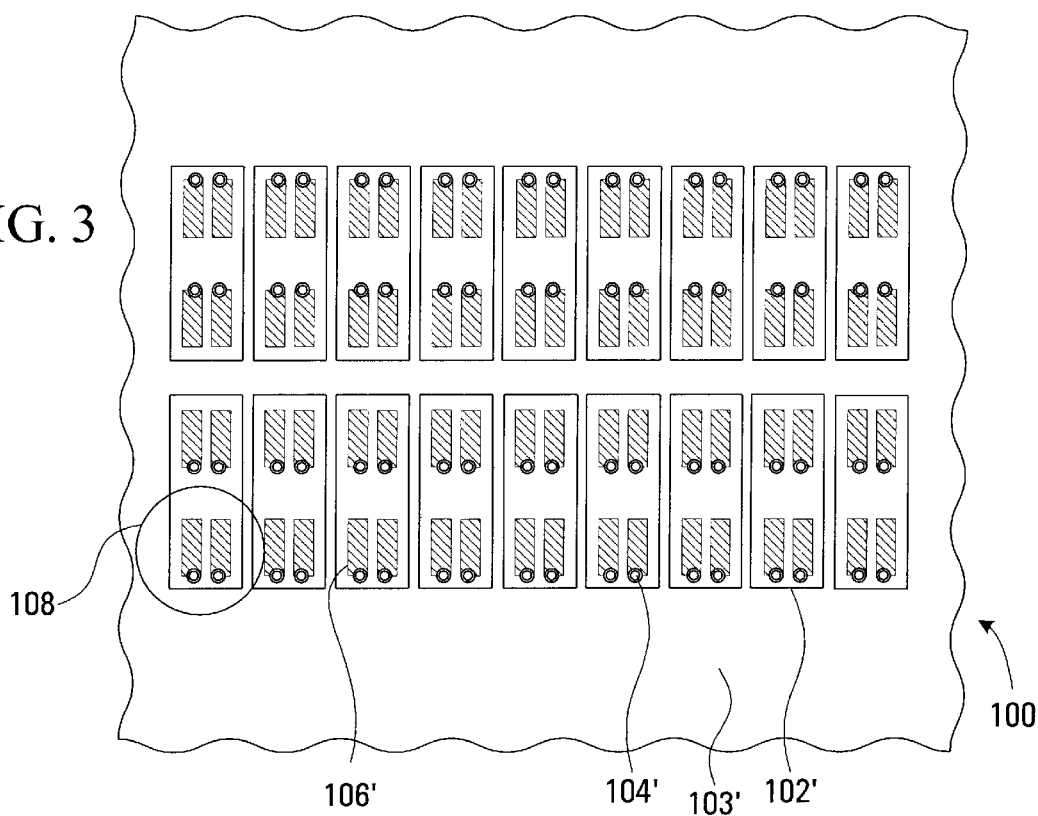
FIG. 3 is an enlarged fragmentary planar view of the midplane board of FIG. 1, showing the second main surface of the midplane board.

FIG. 3 is an enlarged fragmentary view of the second surface of the midplane board 100 that is opposite the first surface shown in FIG. 2. The second surface has components that are similar to those of the first surface, namely: contact pads 106, microvias 104, and ground clearances 102. The main difference between the components on the first and second surfaces resides in their geometrical relationship. The components on the first surface and the components on the second surface are disposed in rows. The rows of contact pads 106 are designated 107 in the drawing. In each row 107, the contact pads 106 are arranged according to two parallel straight lines 107a, 107b. The lines 107a, 107b are parallel within a common row 107. The rows 107 on one main surface of the midplane board 100 are parallel to one another. The rows 107 on one main surface are perpendicular to the rows 107 on the other main surface of the midplane board 100.

Figure 9:
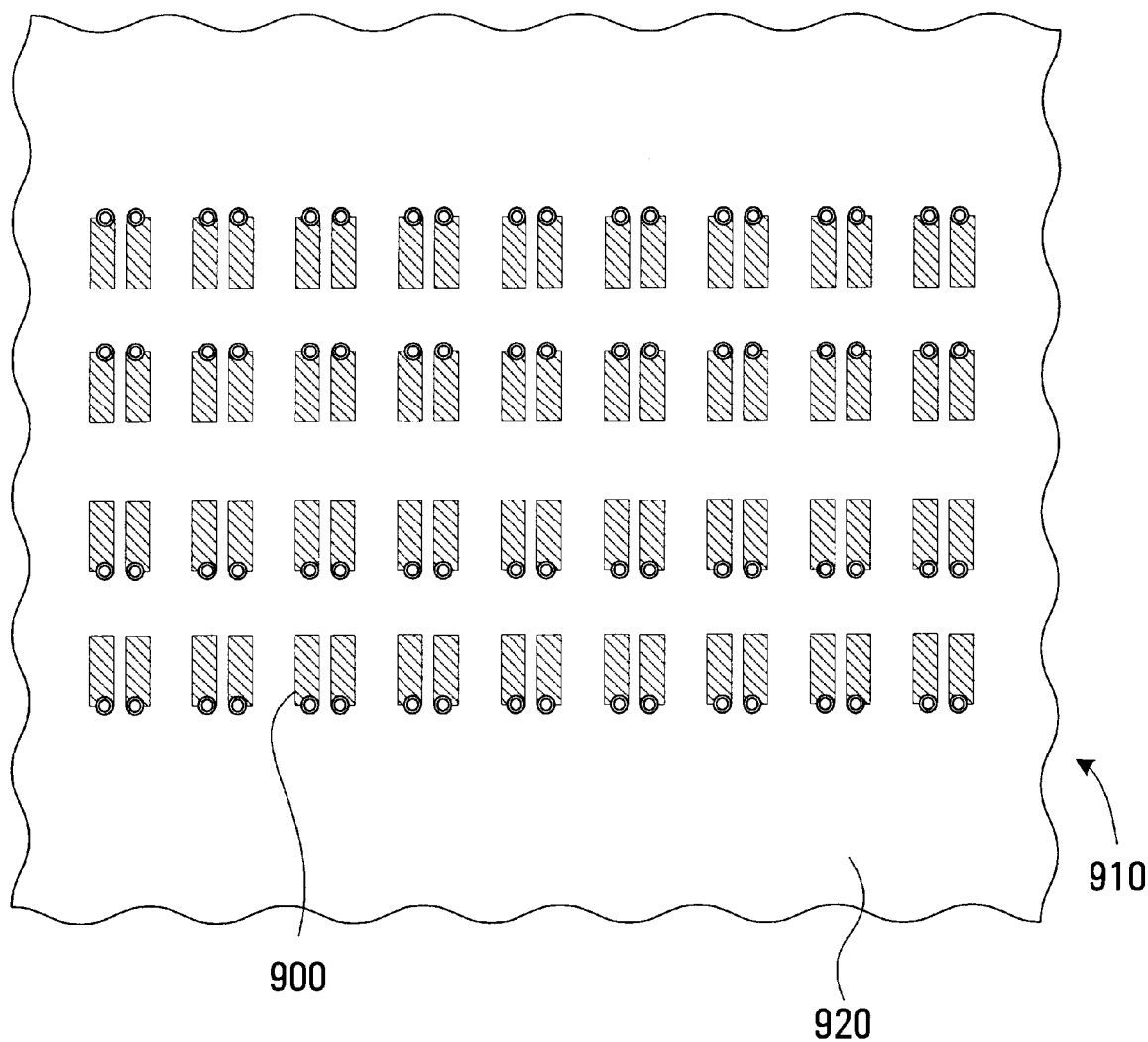
FIG. 9 is an enlarges fragmentary view of the edge of a circuit board suitable for use in connection with the midplane board constructed in accordance with the spirit of the invention.

The contact pads 106 on each line 107a, 107b are designed to engage corresponding contact pads 900 formed on the edge 920 of a circuit board 910, as described in FIG. 9, such that electrical signals can be exchanged between the circuit board 910 and the midplane board 100.

Figure 4:
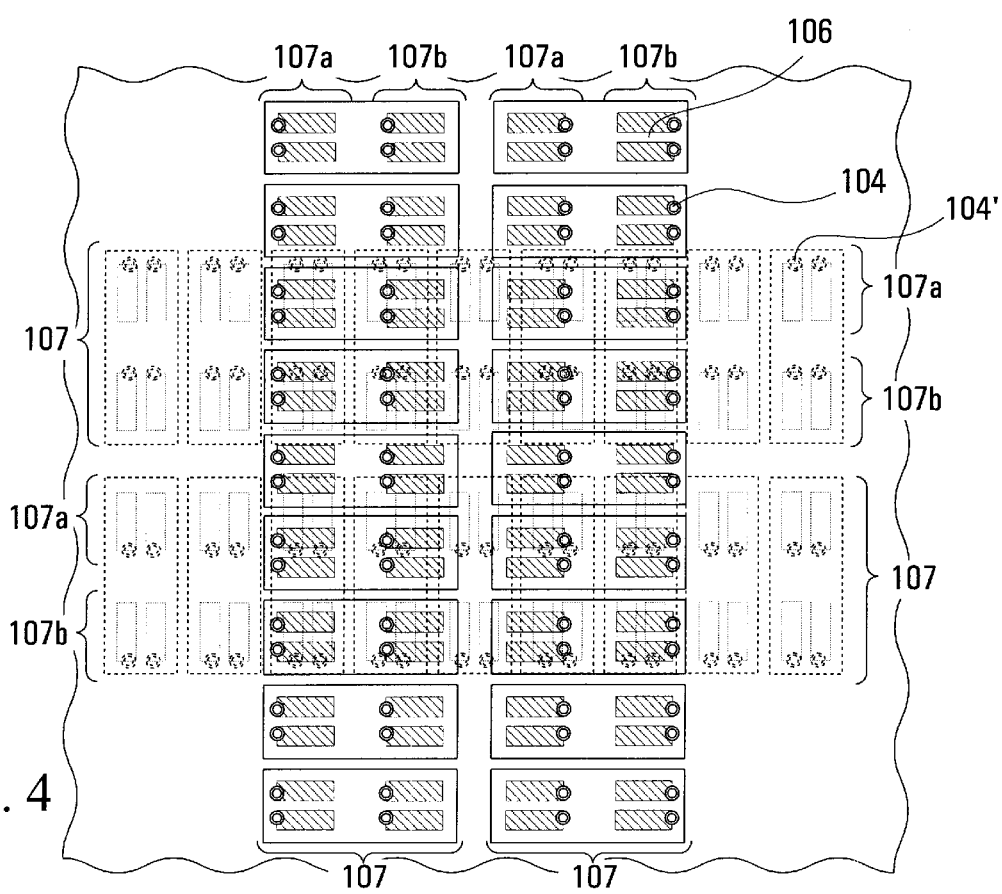
FIG. 4 is a diagram illustrating the geometrical relationship between the contact elements on the first and on the second main surfaces of the midplane board.

FIG. 4 also shows how the microvias 104, 104' on the first and second surfaces of the midplane board 100 are positioned relative to each other. More specifically, the figure shows the components on the first surface in solid lines while the components on the second surface appear in dotted lines.

Figure 5:
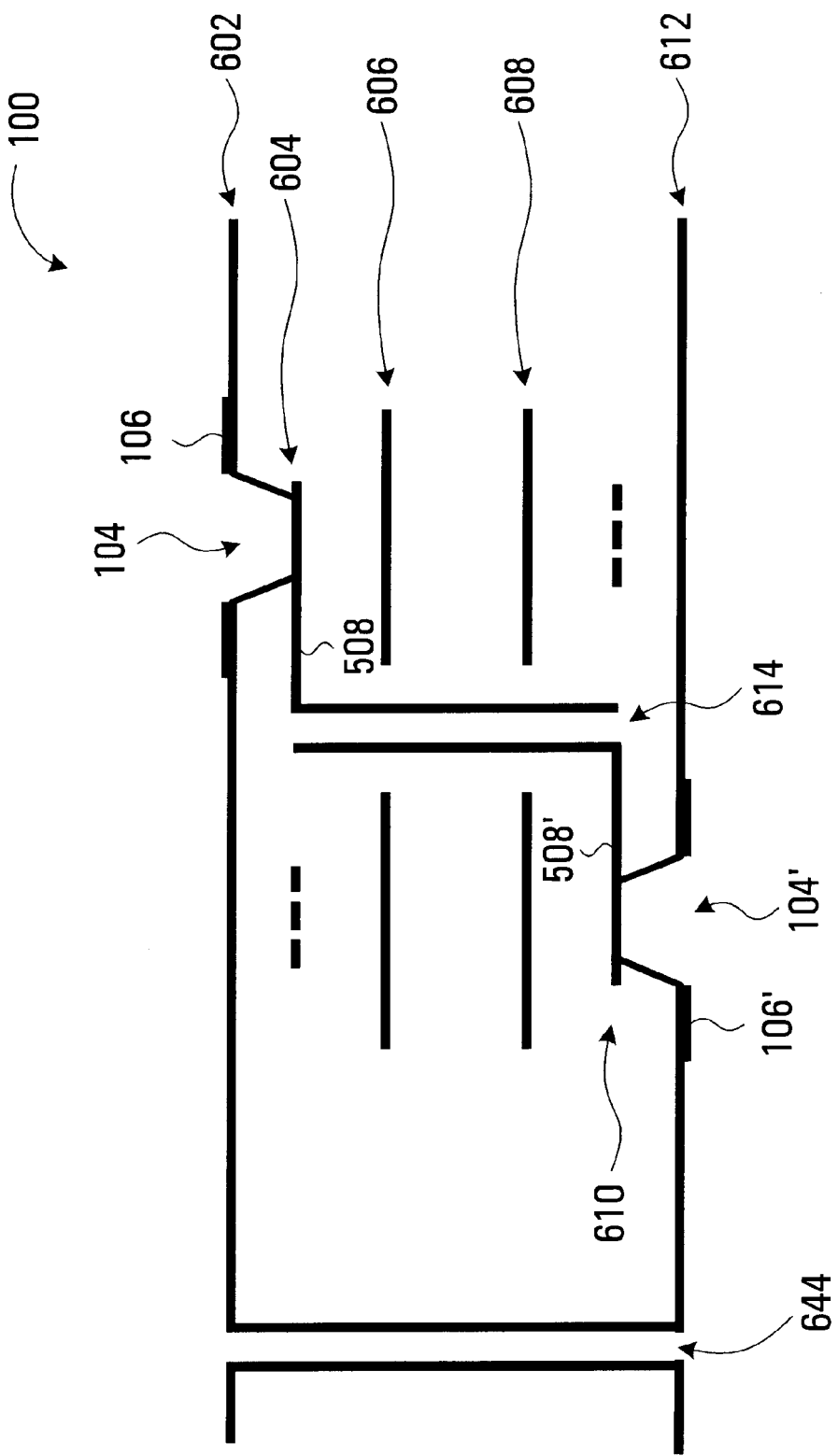
FIG. 5 is an enlarged fragmentary cross-sectional view of the midplane board shown in FIG. 1.

FIG. 5 is an enlarged fragmentary cross-sectional view of the midplane board 100. The midplane board 100 is a six-layer structure and includes a first external layer 602, a first signal layer 604 below the layer 602, a first intermediate layer 606 below the layer 604, a second intermediate layer 608, a second signal layer 610 and a second external layer 612. Each of the first and second external layers 602, 612 carries the surface contact elements, namely the contact pads 106 106'. The contact pads 106 106' on the external layer 602 and the second external layer 612 are connected, via the microvias 104 104', to the first and second signal layers 604, 610 respectively. In turn, the first and the second signal layers 604 and 610 connect to one another through buried vias 614. In this fashion, an electrical connection is realized between contact pads 106 and 106'. Each of the first and second external layers 602, 612, as discussed previously, is adapted to receive circuit boards. Hence, electrical signals can be conveyed, via the interior midplane board 100, between circuit boards located on opposite surfaces of a midplane board 100.

FIG. 5 further shows that the midplane board 100 comprises several through vias 644 (only one is shown in the figure) operative to maintain the first and second surfaces 602, 612 at a common ground voltage level by interconnecting the ground planes 103, 103' to one another. Finally, in a first form of implementation the purpose of the first and second intermediary layers 606 608 is to provide power distribution. In particular, the first intermediary layer 606 connects to the positive terminal of a power supply (such as a battery) while the second intermediate layer 608 connects to the negative terminal of the power supply. Although FIG. 5 shows the midplane board 100 as comprising a power layer and a power return layer, it should be expressly understood that other forms of intermediary layers, such as two ground layers, remain within the scope of this invention. Optionally, the first and second intermediary layers 606 are ground layers 608 having localized perforations or a mesh configuration in the areas about the contact pads 106 106'. In certain cases the use of such localized perforations can reduce stray capacitances between the contact pads.

Figure 6:
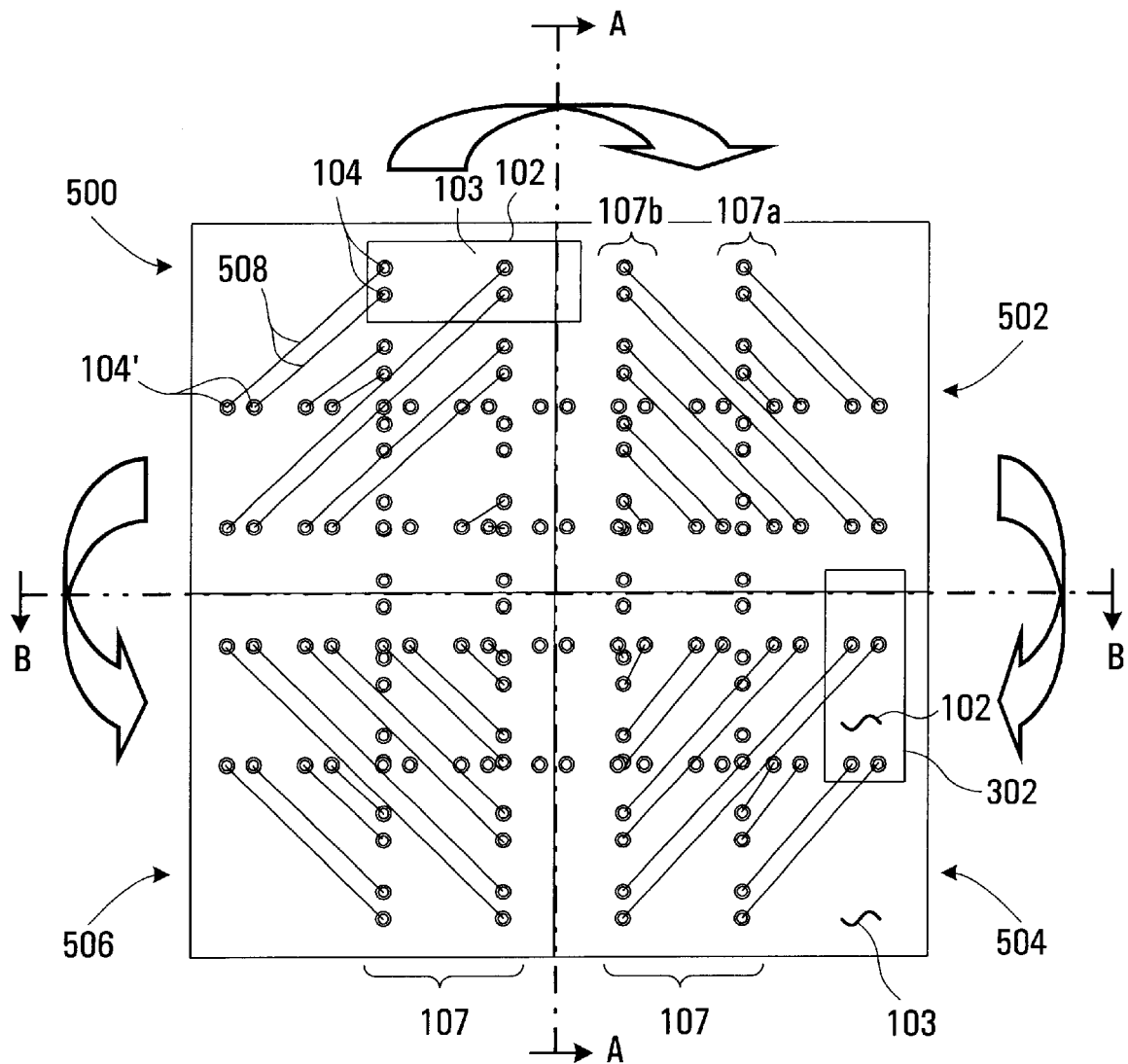
FIG. 6 is a simplified diagram of the signal connection paths at an intersect area of the midplane board of FIG. 1.

FIG. 6 is a schematic diagram of the connection paths within the midplane board 100 to connect the microvias 104 104', hence the contact pads 106 106', on the first surface of the midplane board 100 to those on the second surface at an intersect area. Note that for clarity, the contact pads 106, 106' have not been shown in FIG. 6. Signal connection paths 25 link the microvias 104 to microvias 104' and, in doing so, define a certain pattern. The intersect area is subdivided into four quadrants, namely: a first quadrant 500, a second quadrant 502, a third quadrant 504, and a fourth quadrant 506 where this pattern is repeated which has the advantage of reducing design time. During the design of the midplane board a pattern of the signal connection paths 25 is created in the first quadrant 500. The pattern is then subsequently reproduced onto the second quadrant 502 by taking a mirror image along line A—A. The pattern in the first and second quadrants is then reproduced by taking a mirror image along line B—B to create the connections in the third and fourth quadrants 504 506.

It is to be understood that the division of the intersect area in quadrants is not an essential requirement as the area may be divided into any other number of sub-areas without detracting from the spirit of the invention.

Figure 7:
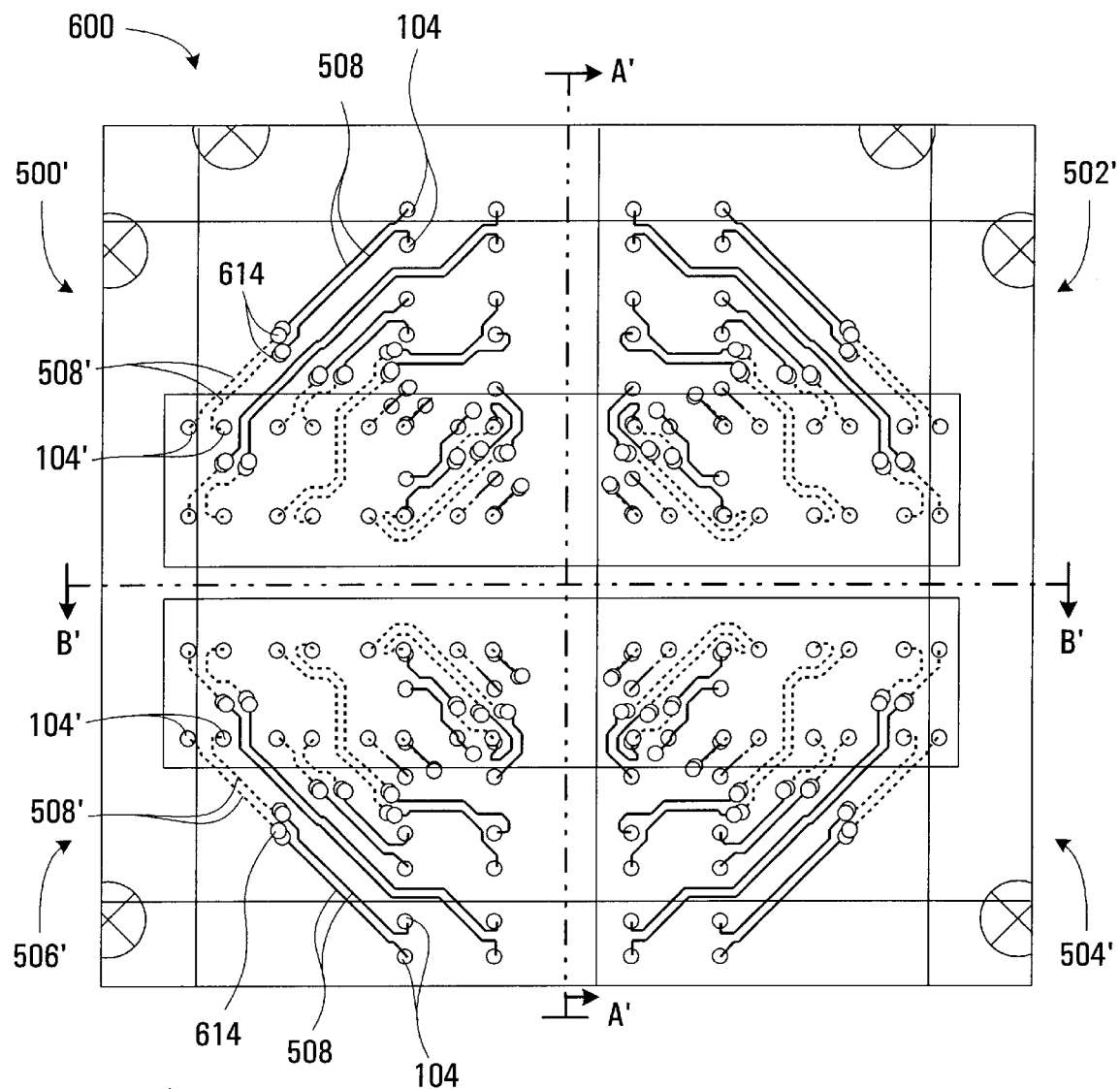
FIG. 7 shows the pattern defined by the signal connection paths at an intersect area of the midplane board of FIG. 1.

FIG. 7 illustrates in greater detail how the microvias 104 are connected to the microvias 104' at an intersect area in accordance with a specific example of implementation of the invention. As discussed earlier, the intersect area is divided into four quadrants, namely: a first quadrant 500', a second quadrant 502', a third quadrant 504', and a fourth quadrant 506'. Microvias 104, 104' within a quadrant, such as the first quadrant 500', are connected by means of signal connection paths including buried vias 614 and conductive pathways 508 formed on the first and second signal layers 604, 610. More specifically, a plurality of conductive pathways 508 are formed on the first signal layer 604 that connect the microvias 104 to the respective buried vias 614. The buried vias 614 connect the first signal layer 604 to the second signal layer 610. Finally, the conductive pathway 508' (shown in dotted lines) on the second signal layer 610 connects the buried vias 614 to the microvias 104'.

Figure 8:
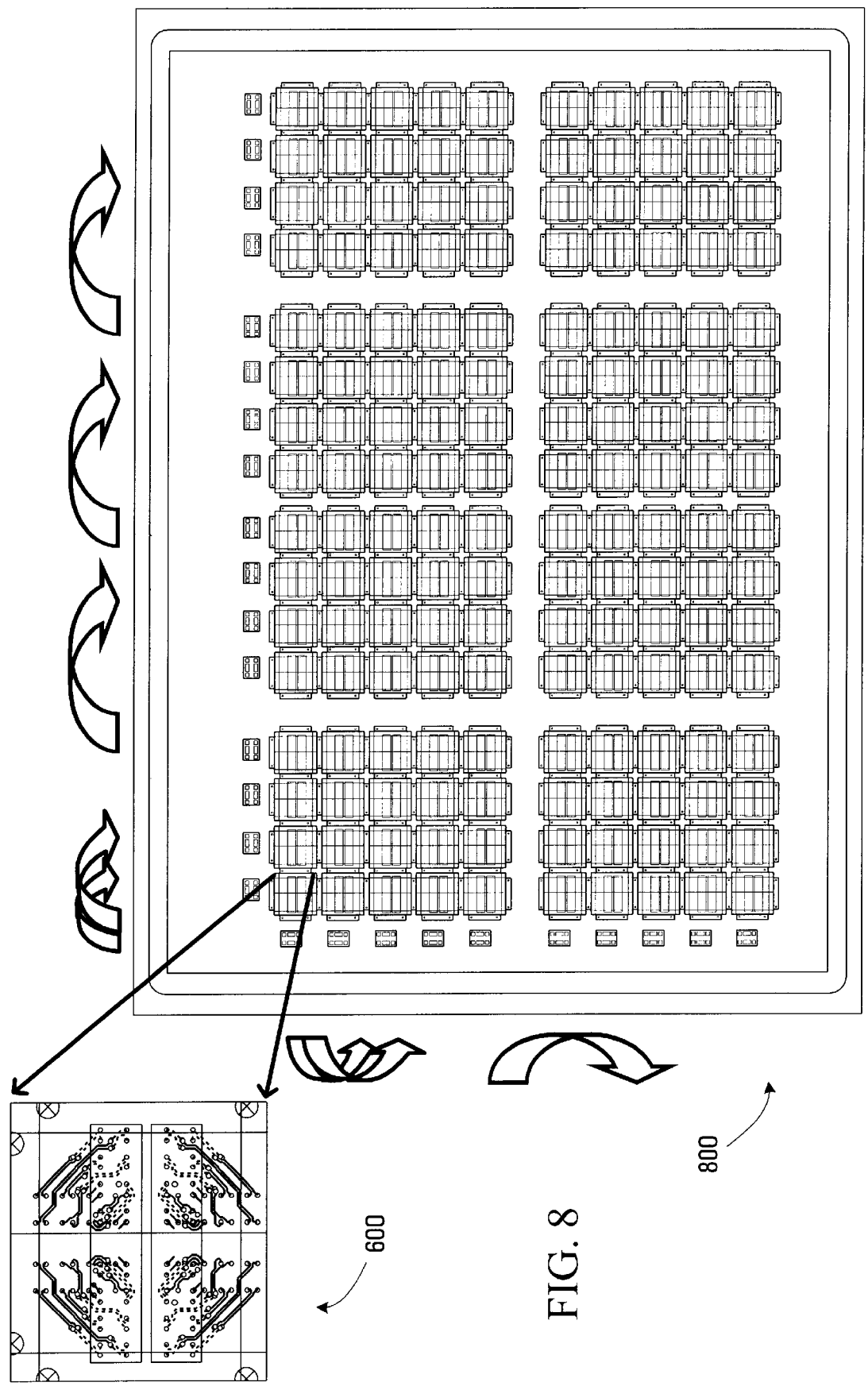
FIG. 8 is a complete planar view of the midplane board shown in FIG. 1.

The conductive pathways 508, 508', buried vias 614, and microvias 104, 104' in the first quadrant 500' define a pattern. As discussed in connection with FIG. 6, the pattern in the first quadrant is reproduced onto the second quadrant 502' by taking a mirror image along line A'—A'. The pattern in the first and second quadrants 500' 502' is then reproduced by taking a mirror image along line B'—B'. The four quadrants 500' 502' 504' 506' therefore form a unique pattern tile 600. The pattern tile 600, as shown in FIG. 8, is repeated on the entire surface of the midplane board 800. This modular approach reduces the design cost and production time by avoiding the duplication of layout work.

Although the present invention has been described in considerable detail with reference to certain preferred embodiments thereof, variations and refinements are possible without departing from the spirit of the invention. Therefore, the scope of the invention should be limited only by the appended claims and their equivalents.

What is claimed is:

1. A midplane board comprising:
    a first surface having a plurality of surface contact elements adapted to engage corresponding contact elements on a first circuit board;
    a second surface, opposite said first surface, said second surface comprising a plurality of surface contact elements adapted to engage corresponding contact elements of a second circuit board;
    the surface contact elements on said first surface being positioned relative the surface contact elements on the second surface such that a portion of a side of the first circuit board is opposed to a portion of a side of the second circuit board when the first and the second circuit boards engage said first and said second surfaces; and
    a set of signal connection paths, each signal connection path extending through said midplane board from a contact element on said first surface to a contact element on said second surface, thereby allowing an electrical signal to propagate from the contact element on said first surface to a contact element on said second surface, wherein said set of signal connection paths defines a certain pattern tile having a symmetrical layout along a given axis.

2. A midplane board as defined in claim 1, wherein said first surface includes a plurality of surface contact elements disposed according to a straight line.

3. A midplane board as defined in claim 2, wherein said first surface includes a plurality of surface contact elements arranged according to a plurality of straight lines.

4. A midplane board as defined in claim 3, wherein said straight lines are parallel to one another.

5. A midplane board as defined in claim 2, wherein said straight line is a first straight line, said second surface includes a plurality of surface contact elements disposed along a second straight line, said first straight line is generally perpendicular to said second straight line.

6. A midplane board as defined in claim 1, wherein said midplane board has multiple layers.

7. A midplane board as defined in claim 6, wherein at least one of said signal connection paths comprises a buried via.

8. A midplane board as defined in claim 7, wherein at least one of said signal connection paths comprises a microvia.

9. A midplane board as defined in claim 8, wherein said microvia extends on said first surface and electrically connects with a surface contact element thereon.

10. A midplane board as defined in claim 1, wherein said contact elements include contact pads.

11. A midplane board as defined in claim 10, wherein said contact pads are made of a conductive material.

12. A midplane board as defined in claim 10, wherein said contact pads are of oblong shape.

13. A midplane board as defined in claim 12, wherein said contact pads are grouped in differential pairs.

14. A midplane board as defined in claim 1, wherein said first surface includes a ground plane.

15. A midplane board as defined in claim 14, wherein said second surface includes a ground plane.

16. A midplane board as defined in claim 15, wherein the ground plane on said first surface is electrically connected to the ground plane of said second surface.

17. A midplane board as defined in claim 16, wherein the ground plane on said first surface is electrically connected to the ground plane of said second surface by a via passing through said midplane board.

18. A midplane board as defined in claim 16, wherein the ground plane includes localized perforations.

19. A midplane board adapted for use in an electronic equipment shelf, said midplane board comprising:
    a first surface comprising a plurality of contact elements adapted to engage corresponding contact elements on a first circuit board, said plurality of contact elements defining a first pattern;
    a second surface, in opposite relationship with said first surface, said second surface comprising a plurality of contact elements adapted to engage corresponding contact elements on a second circuit board, said plurality of contact elements defining a second pattern; and
    at least one intersect area where at least a portion of the first pattern is opposite at least a portion of the second pattern, the at least one intersect area comprising a set of signal connection paths suitable for establishing a connection between said contact elements on said first surface and said contact elements on said second surface, said set of signal connection paths defining a certain pattern tile having a symmetrical layout along a given axis.

20. A midplane board as defined in claim 19, wherein the given axis is a first axis, the certain pattern tile having a symmetrical layout along a second axis.

21. A midplane board as defined in claim 20, wherein said midplane board comprises a plurality of intersect areas, each intersect area comprising a respective set of signal connection paths suitable for establishing a connection between said contact elements on said first surface and said contact elements on said second surface.

22. A midplane board as defined in claim 21, wherein each respective set of signal connection paths defines a certain pattern tile having a symmetrical layout along a given axis.

23. A midplane board as defined in claim 22, wherein the given axis is a first axis, the certain pattern tile having a symmetrical layout along a second axis.

24. A midplane board comprising:
    a first surface having a plurality of surface contact elements adapted to engage corresponding contact elements on a first circuit board;
    a second surface, opposite said first surface, said second surface comprising a plurality of surface contact ele ments adapted to engage corresponding contact elements of a second circuit board;

the surface contact elements on said first surface being positioned relative the surface contact elements on the second surface such that a portion of a side of the first circuit board is opposed to a portion of a side of the second circuit board when the first and the second circuit boards engage said first and said second surfaces; and at least one signal connection path extending through said midplane board from a contact element on said first surface to a contact element on said second surface, thereby allowing an electrical signal to propagate from the contact element on said first surface to a contact element on said second surface.

* * * * *